United States Patent
Kim et al.

(10) Patent No.: US 11,511,321 B2
(45) Date of Patent: Nov. 29, 2022

(54) SUBSTRATE PROCESSING METHOD AND SUBSTRATE PROCESSING APPARATUS

(71) Applicant: SEMES CO., LTD., Cheonan-si (KR)

(72) Inventors: Young Jin Kim, Seoul (KR); Jin Tack Yu, Asan-si (KR); Bu Young Jung, Cheonan-si (KR); Byung Sun Bang, Hwaseong-si (KR); Seung Hoon Oh, Cheonan-si (KR); Young Jun Choi, Asan-si (KR); Jong Hyeon Woo, Asan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 16/662,020

(22) Filed: Oct. 23, 2019

(65) Prior Publication Data
US 2020/0130025 A1 Apr. 30, 2020

(30) Foreign Application Priority Data

Oct. 25, 2018 (KR) ........................ 10-2018-0128103

(51) Int. Cl.
*B08B 3/04* (2006.01)
*H01L 21/67* (2006.01)
*H01L 21/02* (2006.01)

(52) U.S. Cl.
CPC ........ *B08B 3/048* (2013.01); *H01L 21/02082* (2013.01); *H01L 21/67034* (2013.01)

(58) Field of Classification Search
CPC ................ B08B 3/08; H01L 21/02082; H01L 21/67034
See application file for complete search history.

(56) References Cited

U.S. PATENT DOCUMENTS

| | | | |
|---|---|---|---|
| 6,770,151 B1* | 8/2004 | Ravkin | H01L 21/02052 134/33 |
| 7,964,042 B2 | 6/2011 | Kojimaru et al. | |
| 11,033,929 B2* | 6/2021 | Fujiwara | B05D 1/002 |
| 2003/0000034 A1* | 1/2003 | Welsh | H01L 21/67051 15/77 |
| 2003/0192570 A1* | 10/2003 | Thakur | B08B 3/024 134/1.3 |
| 2005/0252526 A1* | 11/2005 | Ogawa | B08B 3/04 134/2 |

(Continued)

FOREIGN PATENT DOCUMENTS

| | | |
|---|---|---|
| JP | 2008-177495 | 7/2008 |
| KR | 10-2006-0065616 | 6/2006 |

(Continued)

OTHER PUBLICATIONS

Office Action dated Nov. 25, 2019 by Korea Intellectual Patent Office (KIPO).

*Primary Examiner* — Sharidan Carrillo

(57) ABSTRACT

A substrate processing method includes forming a high surface tension liquid film by supplying high surface tension liquid on a substrate surface, replacing the high surface tension liquid film with low surface tension liquid by supplying the low surface tension liquid to a center area of a substrate so that the low surface tension liquid impinges on the high surface tension liquid film formed on the center area of the substrate, and supplying high surface tension liquid for a predetermined period of time during the supplying the low surface tension liquid.

12 Claims, 7 Drawing Sheets

(56) References Cited

U.S. PATENT DOCUMENTS

| | | | |
|---|---|---|---|
| 2006/0042722 A1* | 3/2006 | Kim | H01L 21/67034 |
| | | | 141/100 |
| 2006/0081269 A1 | 4/2006 | Kim et al. | |
| 2007/0199579 A1 | 8/2007 | Hayasaki et al. | |
| 2014/0053869 A1* | 2/2014 | Chen | H01L 21/02052 |
| | | | 134/6 |
| 2016/0027635 A1* | 1/2016 | Okamura | H01L 21/02041 |
| | | | 134/29 |
| 2017/0047219 A1* | 2/2017 | Shinohara | F26B 15/04 |
| 2020/0058522 A1* | 2/2020 | Lee | H01L 21/02057 |
| 2020/0130025 A1* | 4/2020 | Kim | H01L 21/02052 |

FOREIGN PATENT DOCUMENTS

| | | |
|---|---|---|
| KR | 10-2007-0082880 | 8/2007 |
| KR | 10-2009-0013013 | 2/2009 |
| KR | 10-2015-0000671 | 1/2015 |

* cited by examiner

SUBSTRATE PROCESSING METHOD AND SUBSTRATE PROCESSING APPARATUS

CROSS REFERENCE TO RELATED APPLICATION

This application claims priority under 35 U.S.C. § 119 to Korean Patent Application No. 10-2018-0128103, filed on Oct. 25, 2018 in the Korean Intellectual Property Office, the disclosure of which is incorporated by reference in its entirety.

BACKGROUND OF THE INVENTION

Field of the Invention

The present invention relates to an apparatus and a method for processing a substrate, which are capable of drying efficiently a substrate after cleaning.

Description of the Related Art

A number of dry methods have been proposed to remove a rinse liquid adhering to a substrate surface after chemical liquid processing by a chemical liquid and rinse processing by a rinse liquid such as purified water (de-ionized water, DIW) are performed.

As one of the methods, a dry method using a low surface tension liquid is known. The low surface tension liquid contains an organic solvent component such as isopropyl alcohol (IPA) having a lower surface tension than purified water (DIW).

For example, patent document 1 discloses a method of discharging IPA on a center area of a substrate after maintaining a DIW liquid film on a substrate rotated at relatively low rotational speed when DIW is replaced with IPA.

However, in this method, an IPA replacement area does not evenly extend in a direction toward an outer diameter of the substrate from the center area thereof where IPA is discharged, and an area in which DIW is partially replaced with IPA, for example, an empty space (finger) is generated. In this state, when the substrate is dried, there is concern about particles may be generated in the above-described area.

DOCUMENTS OF RELATED ART (Patent Document 1) Korean Patent No. 10-0935977

SUMMARY OF THE INVENTION

Accordingly, the present invention has been made keeping in mind the above problems occurring in the related art, and the present invention is intended to propose an apparatus and a method for processing a substrate, which are capable of effectively replacing de-ionized water (DIW) with isopropyl alcohol (IPA).

The objective of the present invention is not limited to the foregoing, and other objectives and advantages of the present invention which are not mentioned may be understood by the following description.

According to an exemplary embodiment of the present invention, there is provided a substrate processing method including: forming a high surface tension liquid film by supplying high surface tension liquid on a substrate surface; replacing the high surface tension liquid film with low surface tension liquid by supplying the low surface tension liquid to a center area of the substrate so that the low surface tension liquid impinges on the high surface tension liquid film formed on the center area of the substrate; further supplying high surface tension liquid for a predetermined period of time during the supplying the low surface tension liquid.

A substrate processing apparatus according to an embodiment of the present invention may include: a chamber; a spin chuck rotatably provided in the chamber and configured to support a substrate; a DIW nozzle arm provided at one side of the spin chuck and having a DIW injection nozzle injecting DIW on a substrate surface; and an IPA nozzle arm provided at one side of the spin chuck and having an IPA injection nozzle injecting IPA on the substrate surface.

In addition, a substrate processing apparatus according to another embodiment of the present invention may include: a chamber; a spin chuck rotatably provided in the chamber and configured to support a substrate; and a nozzle arm provided at a first side of the spin chuck and having a DIW injection nozzle injecting DIW on a substrate surface and an IPA injection nozzle injecting IPA on the substrate surface, wherein the DIW injection nozzle may have a first DIW nozzle injecting DIW on a center area of the substrate and a second DIW nozzle injecting DIW on a middle area of the substrate.

According to the embodiments of the present invention, the low surface tension liquid (IPA) is supplied to the substrate surface where the high surface tension liquid film (DIW film) is formed so that DIW is replaced with IPA, and then DIW is further injected from the DIW injection nozzle on the area outside the area where DIW is replaced with IPA. Accordingly, when IPA is injected on the center of the substrate to replace DIW, the IPA replacement area of the substrate extends evenly in a radius direction from the center area of the substrate, so that a drying process can be effectively performed.

The present invention is not limited to the above-described effect, and should be understood to include all effects inferred from the detailed description of the present invention and the configuration of the present invention described in the accompanying claims.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
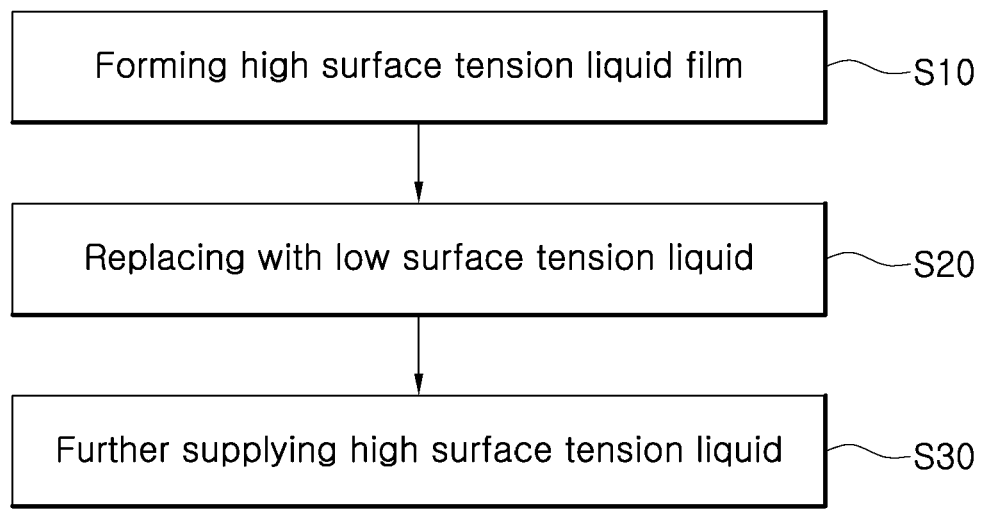
FIG. 1 is a flowchart showing a substrate processing method according to an embodiment of the present invention.

Hereinbelow, exemplary embodiments of the present invention will be described in detail with reference to the accompanying drawings. Various changes to the embodiments of the invention are possible, and the scope of the invention is not limited to the embodiments described below.

In order to clearly describe the present invention, elements incorporated herein will be omitted when it may make the subject matter of the present invention unclear, and the same reference numerals will be used throughout the specification to refer to the same or like elements or parts.

In the specification, when an element is referred to "include" another element, it will be understood that it may "further include" the other element rather than "exclude" the other element unless otherwise defined. All terms used herein are for describing particular embodiments only and is not intended to limit the present invention. Unless otherwise defined, the terms may have the same meaning as commonly understood by one of ordinary skill in the art to which the present invention belongs.

FIG. 1 is a flowchart showing a substrate processing method according to an embodiment of the present invention.

Referring to FIG. 1, the substrate processing method according to the embodiment of the present invention includes a rinse process and a drying process.

The rinse process includes forming a high surface tension liquid film on a surface of a substrate that is rotated at predetermined rotational speed by a spin chuck 200 (S10). That is, the forming the high surface tension liquid film S10 removes a chemical liquid on the substrate surface cleaning-treated by the chemical liquid or the like by supplying a rinse liquid that is a high surface tension liquid. For example, de-ionized water (DIW) may be used as the high surface tension liquid.

In the embodiment of the present invention, the substrate surface means a pattern formation surface on which a device pattern is formed of the substrate.

In the embodiment of the present invention, the substrate may be divided into three areas for convenience of description. For example, a range from the center of the substrate to within a predetermined radius, where the low surface tension liquid is impinged, may be classified as a center area (CA), a range from an outer end of the CA to within a predetermined radius outward the CA may be classified as a middle area (MA), and a range from an outer end of the MA to within an edge of the substrate may be classified as an edge area (EA) (referring to FIG. 2).

In the forming a high surface tension liquid film (S10), a DIW nozzle in a standby position is swung to a center side of the substrate and then discharges DIW. The substrate is rotated at the predetermined rotational speed by the spin chuck 200, so that the DIW discharged on the CA of the substrate is dispersed in a radius direction of the substrate by a centrifugal force of the substrate.

It is more preferable that a DIW nozzle arm is provided with a DIW injection nozzle for CA and a DIW injection nozzle for MA to discharge DIW on both the CA and the MA of the substrate simultaneously. That is, when DIW is discharged on only the CA, a liquid film may not be evenly formed even when the DIW is dispersed in the substrate radius direction by the centrifugal force of the substrate. Therefore, it is preferable that DIW is discharged on the MA of the substrate as well as the CA thereof. DIW may be discharged such that total flow rate of DIW discharged on the substrate may be divided in half for the CA and MA.

The drying process includes replacing the high surface tension liquid film formed on the substrate with the low surface tension liquid (S20). In the replacing (S20), in order to remove the high surface tension liquid that forms the film on the substrate surface, the high surface tension liquid is replaced with the low surface tension liquid. For example, isopropyl alcohol (IPA) may be applied as the low surface tension liquid.

In the replacing the high surface tension liquid with the low surface tension liquid (S20), an IPA nozzle arm in a standby position is swung to the center side of the substrate and discharges IPA on the center of the substrate. An IPA injection nozzle of the IPA nozzle arm may inject IPA while being locked at the center side of the substrate, or may inject IPA while passing out (or scanning out) in a direction toward an edge of the substrate.

The drying process includes further supplying high surface tension liquid to the substrate (S30). For example, when the high surface tension liquid is replaced with the low surface tension liquid, fingering (that is an empty space formed in the MA of the substrate) may occur. In order to prevent the fingering, the high surface tension liquid is further supplied to the MA of the substrate. Thus, when the replacement with the low surface tension liquid is performed, the fingering on the substrate surface does not generated and the IPA replacement area may evenly extend to the substrate edge.

In the drying process, when DIW and IPA are mixed on the substrate, non-wetting may be prevented by maintaining the rotational speed of the spin chuck slower than the rinse process.

Figure 2:
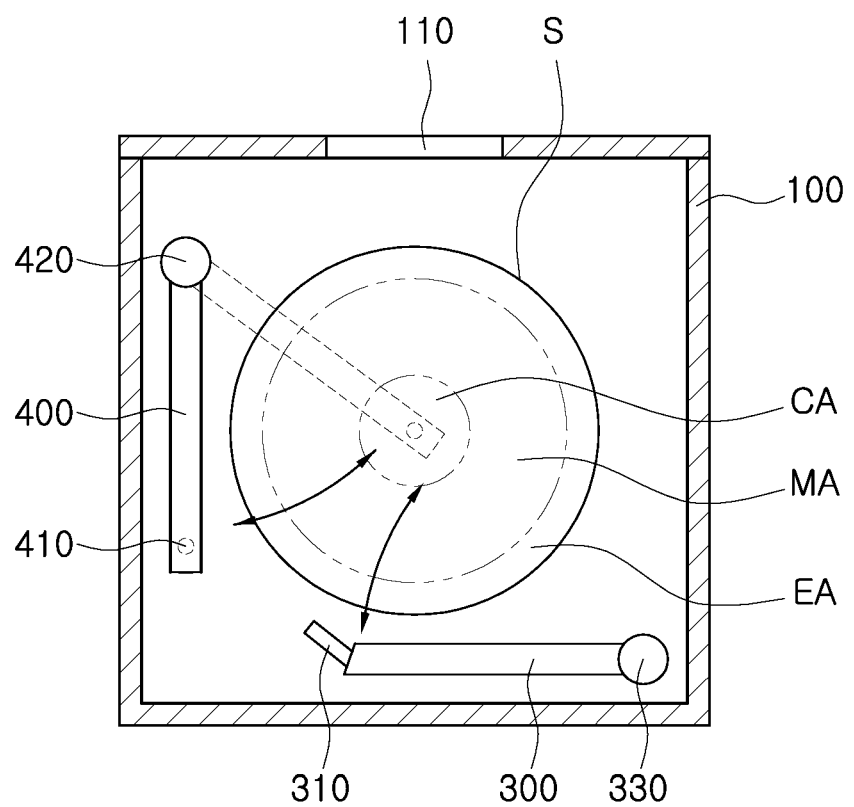
FIG. 2 is a cross-sectional view showing schematically a substrate processing apparatus according to a first embodiment of the present invention.
Figure 3:
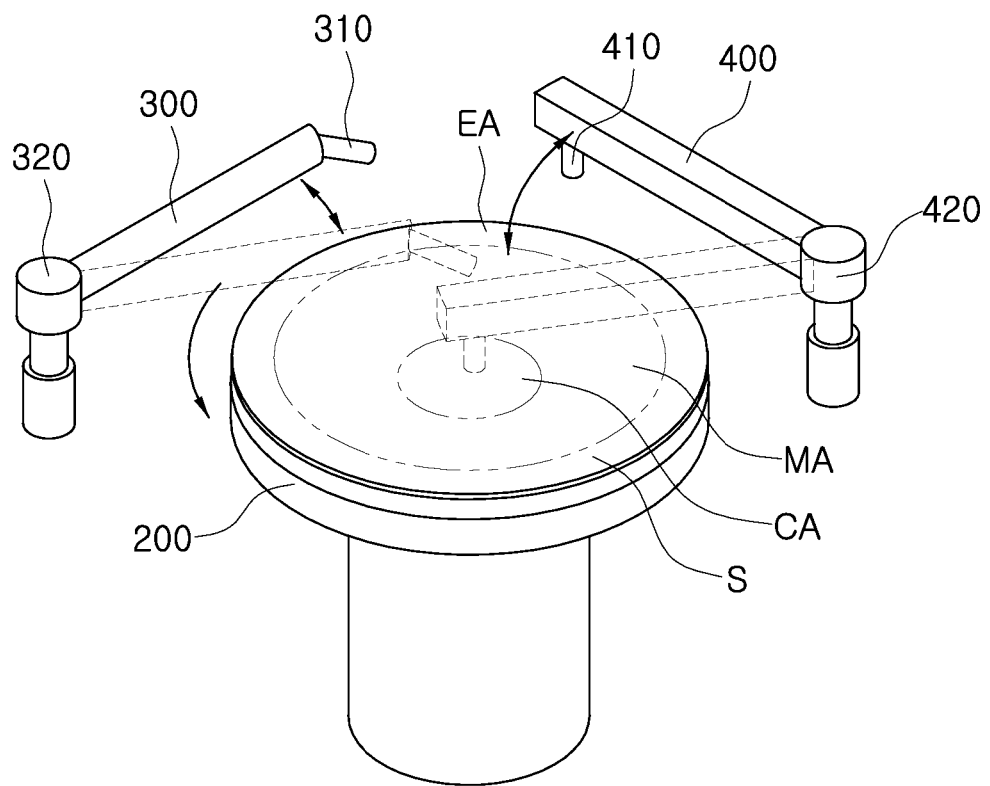
FIG. 3 is a perspective view showing a main part of the substrate processing apparatus according to the first embodiment of the present invention.

FIGS. 2 and 3 are views showing a substrate processing apparatus according to a first embodiment of the present invention.

Referring to FIGS. 2 and 3, the substrate processing apparatus according to the first embodiment includes a chamber 100, the spin chuck 200, the DIW nozzle arm 300, and the IPA nozzle arm 400.

The chamber 100 has an entrance 110 at a first side thereof, so that a substrate to be processed is inserted into the chamber or a processed substrate is taken out.

The spin chuck 200 is disposed approximately in the center of the chamber 100. The spin chuck 200 may be rotated at the predetermined rotational speed by a rotating unit (not shown) such as a motor. The substrate to be processed is seated on the spin chuck 200.

The DIW nozzle arm 300 may be rotatably disposed at a side of the spin chuck 200. A DIW injection nozzle 310 injecting DIW on the substrate surface is provided on a first end of the DIW nozzle arm 300, and a first swingable shaft 320 may be provided on a second end thereof. A DIW supply line (not shown) connected to the DIW injection nozzle 310 is provided inside the DIW nozzle arm 300.

Figure 4:
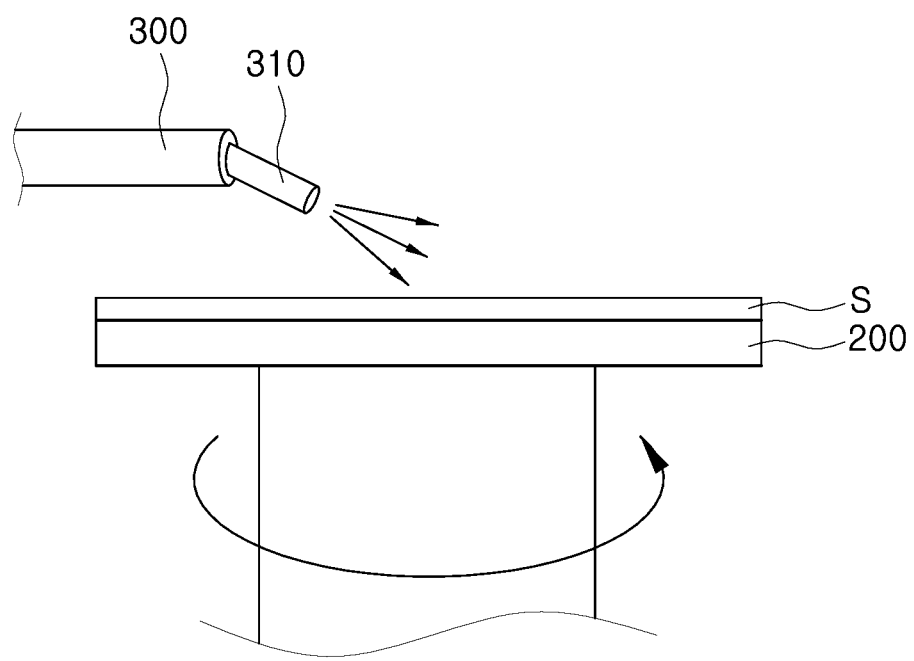
FIG. 4 is a side view showing a part of the substrate processing apparatus according to the first embodiment of the present invention.

The DIW injection nozzle 310 may be disposed to be inclined at an acute angle with respect to the substrate surface. That is, the DIW injection nozzle 310 may be disposed to diagonally inject DIW in the rotational direction of the substrate as shown in FIG. 4. For example, when the DIW injection nozzle 310 is disposed to inject DIW in a direction opposite to the rotational direction of the substrate, patterns formed on the substrate may be damaged by injected DIW.

Figure 5:
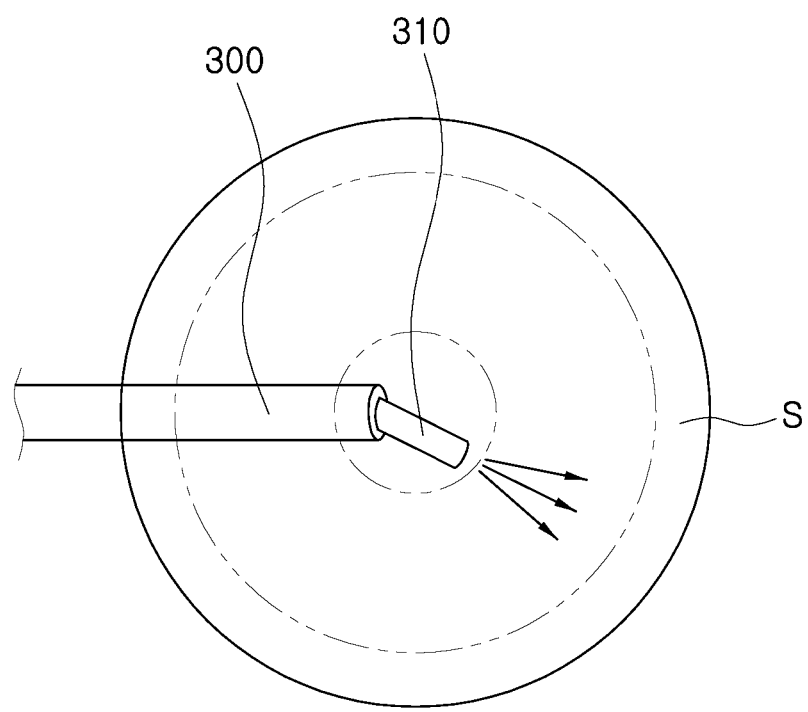
FIG. 5 is a plane view showing a part of the substrate processing apparatus according to the first embodiment of the present invention.

In addition, the DIW injection nozzle 310 may be disposed to inject DIW radially outwards from the center of the substrate as shown in FIG. 5. That is, when DIW is injected on the MA of the substrate with IPA, it is possible to prevent the injected DIW from being scattered into the area where DIW is already replaced with IPA.

The IPA nozzle arm 400 may be rotatably disposed at a position where the IPA nozzle arm 400 does not interfere with the DIW nozzle arm 300. An IPA injection nozzle 410 injecting IPA on the CA of the substrate may be provided at a first end of the IPA nozzle arm 400, and a second swingable shaft 420 may be provided at a second end thereof. When IPA is injected on the substrate, the IPA injection nozzle 410 may be disposed perpendicularly with respect to the substrate surface. An IPA supply line (not shown) connected to the IPA injection nozzle 410 is provided inside the IPA nozzle arm 400.

The DIW injection nozzle 310 is disposed diagonally at the acute angle with respect to the substrate surface and the IPA injection nozzle 410 is disposed perpendicularly with respect thereto. Thus, when the DIW nozzle arm 300 and the IPA nozzle arm 400 are swung for processing, there is no physical interference between the DIW injection nozzle 310 and the IPA injection nozzle 410.

The substrate processing method using the above-described substrate processing apparatus will be described as follows.

First, the rinse process is performed. That is, the substrate surface processed with the chemical liquid is processed with a rinse liquid, that is, the high surface tension liquid.

In the rinse process, while the substrate S on the spin chuck 200 is rotated at the predetermined rotational speed, the DIW injection nozzle 310, which is in a standby state outside the spin chuck 200, is moved to a start position above the CA of the substrate S.

After that, as the rinse liquid, a predetermined amount of DIW is discharged from the DIW injection nozzle 310 toward the substrate surface. Accordingly, the process liquid on the surface of the substrate S is rinsed by the rinse liquid.

The rinse liquid supplied to the substrate S is dispersed from the center of the substrate S in a direction toward an outer diameter of the substrate by the centrifugal force of the rotated substrate S. When the predetermined amount of the rinse liquid is supplied, discharging of the rinse liquid is stopped.

Next, replacement processing with the low surface tension liquid is performed on the substrate surface.

In the replacing with the low surface tension liquid, when the substrate S on the spin chuck 200 is rotated at the predetermined rotational speed, the IPA injection nozzle 410 is moved to a starting position above the CA of the substrate S.

After that, the predetermined amount of IPA is discharged from the IPA injection nozzle 410 toward the substrate surface. The IPA supplied to the substrate S is dispersed in the direction toward the outer diameter of the substrate S from the center thereof by the centrifugal force due to the rotation of the substrate S. Thus, DIW on the substrate surface may be gradually replaced with IPA radially outwardly from the center of the substrate.

Meanwhile, the DIW injection nozzle 310 further injects DIW on a position outside the area where IPA is supplied and DIW is replaced with IPA. As a result, when IPA is injected onto the center of the substrate S to replace DIW with IPA, the fingering in which the empty space is formed outside the IPA replacement area of the substrate S may be prevented. In the area where DIW is injected, an area of mixing IPA and DIW may be formed.

As the IPA replacement area is increased in the direction toward the outer diameter of the substrate S, the DIW nozzle arm 300 is gradually moved in the direction toward the outer diameter of the substrate S. As a result, the area of mixing IPA and DIW may be also gradually moved in the direction toward the outer diameter of the substrate S. When the area of mixing IPA and DIW reaches the EA of the substrate S, DIW injection may be stopped.

Then, an inert gas such as nitrogen gas (N2) is used to remove the low surface tension liquid from the substrate S.

Figure 6:
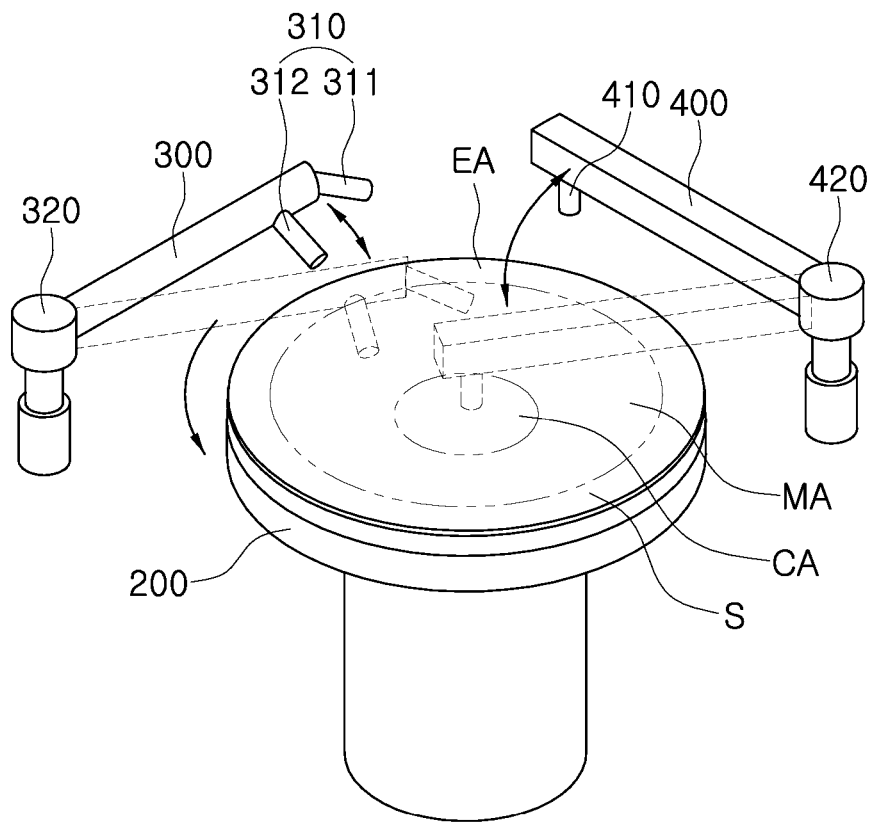
FIG. 6 a perspective view showing a substrate processing apparatus according to a second embodiment of the present invention.

FIG. 6 a perspective view showing a substrate processing apparatus according to a second embodiment of the present invention.

Referring to FIG. 6, the substrate processing apparatus according to the second embodiment includes the chamber 100, the spin chuck 200, the DIW nozzle arm 300, and the IPA nozzle arm 400. The chamber 100, the spin chuck 200, and the IPA nozzle arm 400 are the same or similar with the components of the substrate processing apparatus according to the first embodiment, and the detailed descriptions thereof will be omitted.

The DIW nozzle arm 300 includes the DIW injection nozzle 310 injecting DIW on the substrate surface. The DIW injection nozzle 310 may include a first DIW nozzle 311 and a second DIW nozzle 312 to supply high surface tension liquid on the CA and the MA simultaneously or on the CA or the MA selectively. That is, the first DIW nozzle 311 may inject DIW on the CA of the substrate S and the second DIW nozzle 312 may inject DIW on the MA of the substrate S.

The second DIW nozzle 312 may function to further supply high surface tension liquid to the substrate S. That is, when IPA is injected onto the CA of the substrate and DIW is replaced with IPA in the drying process, the first DIW nozzle 311 for the CA may be blocked, and the second DIW nozzle 312 for the MA may continue to inject DIW. Accordingly, it is possible to prevent the generation of the fingering where boundary between an IPA replacement area and a non-replacement area is unevenly formed. An area where the second DIW nozzle 312 injects DIW may be formed in an area of mixing IPA and DIW.

As the IPA replacement area extends in the direction toward the outer diameter of the substrate S, the DIW nozzle arm 300 is gradually moved in the direction toward the outer diameter of the substrate S. As a result, the area of mixing IPA and DIW may be also gradually moved in the direction toward the outer diameter of the substrate S. When the area of mixing IPA and DIW reaches the EA of the substrate S, DIW injection may be stopped.

The DIW injection nozzle 310 may be disposed to be inclined at the acute angle with respect to the substrate surface. The DIW injection nozzle 310 may be disposed to inject DIW in the same direction as the rotational direction of the substrate. That is, when the DIW injection nozzle 310 is disposed to inject DIW in the direction opposite to the rotational direction of the substrate, the patterns formed on the substrate may be damaged by the injected DIW.

In addition, the DIW injection nozzle 310, especially, the second DIW nozzle 312 may be disposed to inject DIW radially outwardly from the center of the substrate. As a result, when DIW is further supplied with IPA to the MA of the substrate during the process of replacing DIW formed in the film on the substrate with IPA, the injected DIW are not scattered into the area where DIW is already replaced with IPA.

Figure 7:
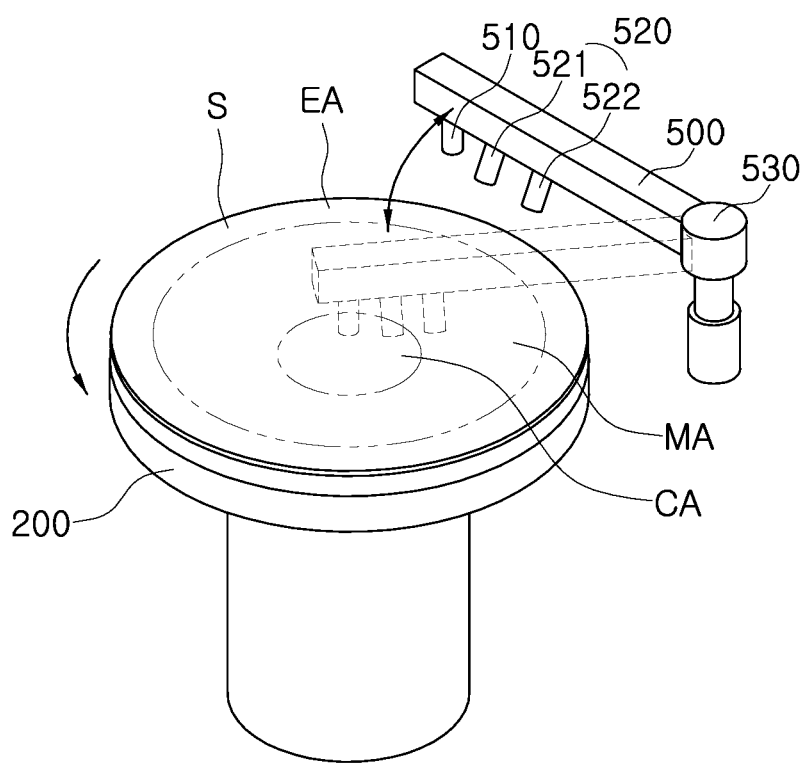
FIG. 7 is a perspective view showing a substrate processing apparatus according to a third embodiment of the present invention.

FIG. 7 is a perspective view showing a substrate processing apparatus according to a third embodiment of the present invention.

Referring to FIG. 7, the substrate processing apparatus according to the third embodiment includes the chamber 100, the spin chuck 200, and a nozzle arm 500. The chamber 100 and the spin chuck 200 are the same or similar with the components of the substrate processing apparatus according to the first embodiment, and the detailed descriptions thereof will be omitted.

An IPA injection nozzle 510 and a DIW injection nozzle 520 may be provided at a first end of the nozzle arm 500, and a swingable shaft 530 may be provided at a second end thereof. Inside the nozzle arm 500, an IPA supply line connected to the IPA injection nozzle 510 and a DIW supply line connected to the DIW injection nozzle 520 are provided respectively.

The IPA injection nozzle 510 is disposed perpendicularly with respect to the substrate surface. The DIW injection nozzle 520 may be inclined at the acute angle with respect to the substrate surface. In addition, the DIW injection nozzle 520 may be disposed to inject DIW in the same direction as the rotational direction of the substrate S.

In addition, the DIW injection nozzle 520 may include a first DIW nozzle 521 for injecting DIW toward the center of the substrate S and a second DIW nozzle 522 for injecting DIW on the MA thereof. The second DIW nozzle 522 may be disposed to inject DIW radially outwards from the center of the substrate S.

Likewise, the substrate processing apparatus according to the third embodiment may have higher space utilization than the first and second embodiments by providing the IPA injection nozzle 510 and the DIW injection nozzle 520 in the nozzle arm 500.

Since the present invention may be embodied in other specific forms without changing the technical spirit or essential features, those skilled in the art to which the present invention belongs should understand that the embodiments described above are exemplary and not intended to limit the present invention.

The scope of the present invention will be defined by the accompanying claims rather than by the detailed description, and those skilled in the art should understand that various modifications, additions and substitutions derived from the meaning and scope of the present invention and the equivalent concept thereof are included in the scope of the present invention.

What is claimed is:

1. A substrate processing method comprising:
forming a liquid film by supplying a first liquid to a substrate;
replacing the liquid film with a second liquid, different from the first liquid, by supplying the second liquid to a center area of the substrate so that the second liquid impinges on the liquid film formed on the center area of the substrate; and
after starting to supply the second liquid to the center area of the substrate, starting to supply a third liquid for a predetermined time diagonally with respect to an upper surface of the substrate during the supplying of the second liquid,
wherein the first liquid and the third liquid is the same liquid,
wherein in the supplying the third liquid, the third liquid is injected radially outwards from the center of the substrate toward an outer edge of the substrate.

2. The substrate processing method of claim 1,
wherein in the supplying the third liquid, the third liquid is injected toward a predetermined position that is outside a position at which the second liquid is injected and the liquid film is replaced with the second liquid.

3. The substrate processing method of claim 1,
wherein in the forming the liquid film, the first liquid is injected diagonally in the same direction as a rotational direction of the substrate.

4. The substrate processing method of claim 1,
wherein in the forming the liquid film, the first liquid is injected on both the center area of the substrate and a middle area outside the center area simultaneously.

5. The substrate processing method of claim 1,
wherein the first liquid is de-ionized water (DIW).

6. The substrate processing method of claim 1,
wherein the second liquid is isopropyl alcohol (IPA).

7. The substrate processing method of claim 4,
wherein a first portion of the first liquid is injected at a first injection flow rate toward the center area of the substrate,
wherein a second portion of the first liquid is injected at a second injection flow rate toward the middle area of the substrate, and
wherein a ratio of the first injection flow rate to the second injection flow rate is a one-to-one ratio.

8. A substrate processing method comprising:
supplying a first liquid to a substrate, wherein a liquid film is formed on the substrate;
replacing the liquid film with a second liquid, different from the first liquid, by supplying the second liquid to a center area of the substrate so that the second liquid impinges on the liquid film formed on the center area of the substrate; and
after starting the supplying of the second liquid, starting to supply a third liquid diagonally with respect to an upper surface of the substrate to a first position outside where a portion of the liquid film is replaced with the second liquid,
wherein the first liquid and the third liquid are the same liquid.

9. The substrate processing method of claim 8,
wherein the third liquid is supplied for a predetermined time during the supplying the second liquid.

10. The substrate processing method of claim 8,
wherein in the forming the liquid film, the first liquid is injected diagonally in the same direction as a rotational direction of the substrate.

11. The substrate processing method of claim 8,
wherein in the supplying the third liquid, the third liquid is injected radially outwards from the center of the substrate toward an outer edge of the substrate.

12. The substrate processing method of claim 9,
wherein for the predetermined time, the first position is moved toward an outer edge of the substrate, and
wherein the third liquid is supplied until the first position reaches the outer edge of the substrate.

* * * * *